US007170957B2

(12) United States Patent
Moy et al.

(10) Patent No.: US 7,170,957 B2
(45) Date of Patent: *Jan. 30, 2007

(54) DEVICE AND METHOD FOR THE DIGITAL DEMODULATION OF A SIGNAL RECEIVED BY SELECTING A FILTER AND DIGITAL COMMUNICATION RECEIVER COMPRISING SAME

(75) Inventors: Christophe Moy, Rennes (FR); Pascal Le Corre, Rennes (FR)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 825 days.

This patent is subject to a terminal disclaimer.

(21) Appl. No.: 10/157,157

(22) Filed: May 30, 2002

(65) Prior Publication Data
US 2002/0181620 A1    Dec. 5, 2002

(30) Foreign Application Priority Data
May 30, 2001    (FR)    ................................. 01 07096

(51) Int. Cl.
*H03D 1/04*    (2006.01)
*H04B 1/16*    (2006.01)
*G06F 17/00*    (2006.01)
*G06F 17/10*    (2006.01)

(52) U.S. Cl. ...................... 375/346; 375/324; 375/350; 455/72; 455/114.2; 708/300; 708/316

(58) Field of Classification Search ................. 375/322, 375/324, 325, 332, 346, 229, 371, 350, 349, 375/348, 232, 340, 355; 455/42, 110, 114.2, 455/293, 323, 296, 307, 308; 370/215, 70; 708/300, 316, 322

See application file for complete search history.

(56) References Cited

U.S. PATENT DOCUMENTS 5,323,391 A * 6/1994 Harrison ...................... 370/210

(Continued)

FOREIGN PATENT DOCUMENTS

DE    43 15 806    11/1994

OTHER PUBLICATIONS

Pending U.S. Appl. No. 10/157,157, filed May 30, 2002.

(Continued)

*Primary Examiner*—Kevin Kim
*Assistant Examiner*—Linda Wong
(74) *Attorney, Agent, or Firm*—Oblon, Spivak, McClelland, Maier & Neustadt, P.C.

(57) ABSTRACT

The device (10) for digital demodulation comprises a polyphase filter (14) comprising a set of N distinct elementary digital filters ($H_i$) and means (16) of selection, for each block of an elementary digital filter ($H_i$). These latter comprise means (28) for computing an error signal, means (30) for comparing performance indicators for the digital filters arising from the error signals and means (30) for determining the elementary digital filter ($H_i$) to be implemented in respect of the following block as a function of the result of the comparison.

The digital filters ($H_i$) are ordered. They are chosen according to the order of the filters, as a function of the result of the comparison performed on the performance indicators for the elementary digital filters ($H_i$) implemented in respect of at least one previous block.

Application to a mobile telephone or base station.

11 Claims, 2 Drawing Sheets

U.S. PATENT DOCUMENTS

| | | | |
|---|---|---|---|
| 5,917,735 A * | 6/1999 | Ko | 708/313 |
| 5,982,832 A * | 11/1999 | Ko | 375/371 |
| 6,134,268 A * | 10/2000 | McCoy | 375/229 |
| 6,141,378 A | 10/2000 | D'Oreye de Lantremange | |
| 6,218,896 B1 | 4/2001 | Becker et al. | |
| 6,430,234 B1 * | 8/2002 | Perlow | 375/321 |
| 6,531,969 B2 * | 3/2003 | Chu | 341/61 |
| 6,662,367 B2 * | 12/2003 | Dapper et al. | 725/105 |
| 2002/0018145 A1 * | 2/2002 | Howald et al. | 348/538 |

OTHER PUBLICATIONS

Pending U.S. Appl. No. 10/157,156, filed May 30, 2002.

* cited by examiner

DEVICE AND METHOD FOR THE DIGITAL DEMODULATION OF A SIGNAL RECEIVED BY SELECTING A FILTER AND DIGITAL COMMUNICATION RECEIVER COMPRISING SAME

BACKGROUND OF THE INVENTION

1. Field of the Invention

The present invention relates to a device for the digital demodulation of a signal received in respect of a digital communication receiver comprising:

a stage for sampling the signal received with an oversampling factor of P samples per symbol;

a stage for chopping the oversampled signal into successive blocks of samples; and means for correcting, for each block, the sampling instant, which means for correcting the sampling instant comprise:

a polyphase filter comprising a set of N distinct elementary digital filters; and means of selection, for each block of an elementary digital filter.

2. Description of the Related Art

In installations for transmitting a signal, between a sending entity and a receiving entity, the digital signal comprising the data to be transmitted, represented by a baseband signal, is modulated into a signal suitable for transmission, in particular over the airwaves.

The receiving entity, or receiver, comprises a device for demodulating the signal received making it possible to reconstruct a baseband signal representative of the data transmitted. This demodulation implements a sampling of the modulated signal for its digitization.

The modulation of the signal and the demodulation of the signal are performed on the basis of a time base imposed, respectively, by the clock of the sending entity and by the clock of the receiving entity.

The clocks of the two entities are only rarely exactly synchronized in terms of frequency and phase, so that a time shift exists between the time bases supplied by the two clocks.

Now, for the digitization of the signal received, which is performed during demodulation, it is necessary for the sampling instants to be placed perfectly so as to utilize the performance of the receiving entity to the maximum. The sought-after position corresponds to the centre of the eye diagram which corresponds to minimizing the inter-symbol interference. However, even if the components involved in the analogue/digital conversion of the receiving entity are perfect, it is not possible to sample the signal at the right instance without a sophisticated feedback system. Such a system ensures correction of the sampling instant in respect of the signal received.

The known systems implement either analogue procedures, which are expensive in terms of components and room, or digital procedures which are expensive in terms of computation time.

The digital procedures customarily perform a double interpolation/decimation, the term "decimation" designating an undersampling. This double interpolation/decimation consumes a great deal of computational power, on the one hand in order to carry out the two functions themselves, and on the other hand, because the interpolation function increases the number of samples, and hence the number of computations to be performed pursuant thereto.

Moreover, the use of a polyphase filter in a receiving entity has been envisaged. Such a polyphase filter comprises a battery of several filters installed in parallel. Only one of the filters is used for the processing of a block of symbols.

In certain devices, the means implemented for the selection of the elementary filter of the polyphase filter perform continuous analysis of the incoming signal and directly determine the elementary filter to be used.

This solution is effective but is however complex to implement and can, in certain circumstances, be unstable.

The aim of the invention is to provide a simple device for the digital demodulation of a signal received ensuring correction of the sampling instant which is simple and allows stable operation.

SUMMARY OF THE INVENTION

Accordingly, the subject of the invention is a device for the digital demodulation of a signal received in respect of a digital communication receiver, of the aforesaid type, characterized in that the means of selection of an elementary digital filter comprise means for computing an error signal, means for comparing performance indicators for the elementary digital filters implemented in respect of at least two successive blocks, the said performance indicators arising from the said error signals, and means for determining the elementary digital filter to be implemented in respect of the next block as a function of the result of the comparison, in that the distinct elementary digital filters are ordered, and in that the means for determining the elementary digital filter to be implemented in respect of the following block are suitable for choosing, as elementary digital filter to be implemented for the following block, the elementary digital filter whose rank with respect to the elementary digital filter previously selected is shifted according to the order of the filters, by a number of spacings and in a direction which are determined as a function of the result of the comparison performed on the performance indicators of the elementary digital filters implemented in respect of at least one previous block.

According to particular embodiments, the device comprises one or more of the following characteristics:

each elementary digital filter is suitable for exercising its own filtering function, possibly a function of cancelling the interference between symbols, or a filtering of the noise;

the number of shifting spacings is a predetermined constant number of spacings;

the number of shifting spacings is variable over time, and that it comprises means for reducing the number of shifting spacings in the course of the implementation of the device;

the set of distinct elementary digital filters are filters of the same kind, mutually differentiated by each filter's own phase;

it comprises a decimating stage for selecting samples in each block on completion of the digital filtering implemented by the processor and means for determining samples to be selected during the processing of each block in the decimating stage;

the said means for determining the samples to be selected comprise means for computing an error signal for each filtered block and means for evaluating the error signal suitable for determining the samples to be selected in the relevant block; and the means for computing an error signal are common to the means of selection of the elementary digital filter to be implemented and to the means for determining the samples to be selected.

The subject of the invention is furthermore a digital communication receiver and a base station of a wireless telecommunication network comprising a device as described above.

Finally, the subject of the invention is a method of digital demodulation of a signal received in respect of a digital communication receiver comprising the steps consisting in:

sampling the signal received with an oversampling factor of P samples per symbol;

chopping the oversampled signal into successive blocks of samples; and correcting, for each block, the instant of sampling, by implementing a polyphase filter comprising a set of distinct elementary digital filters, by selecting, for each block, an elementary digital filter, characterized in that the selecting of an elementary digital filter comprises the steps consisting in:

computing error signals for the polyphase filter;

producing performance indicators for the elementary digital filters from the said error signals;

comparing the performance indicators for the elementary digital filters implemented in respect of at least two successive blocks; and determining the elementary digital filter to be implemented in respect of the following block as a function of the result of the comparison, in that the distinct elementary digital filters are ordered, and in that the step of determining the elementary digital filter to be implemented in respect of the following block is suitable for choosing, as elementary digital filter to be implemented for the following block, the elementary digital filter whose rank with respect to the elementary digital filter previously selected is shifted according to the order of the filters, by a number of spacings and in a direction which are determined as a function of the result of the comparison performed on the performance indicators of the elementary digital filters implemented in respect of at least one previous block.

BRIEF DESCRIPTION OF THE DRAWINGS

The invention will be better understood on reading the description which follows, given merely by way of example and while referring to the drawings, in which.

DETAILED DESCRIPTION OF THE PREFERRED EMBODIMENTS

The preferred embodiments of the present invention will hereinafter be described in detail with reference to the accompanying drawings.

Figure 1:
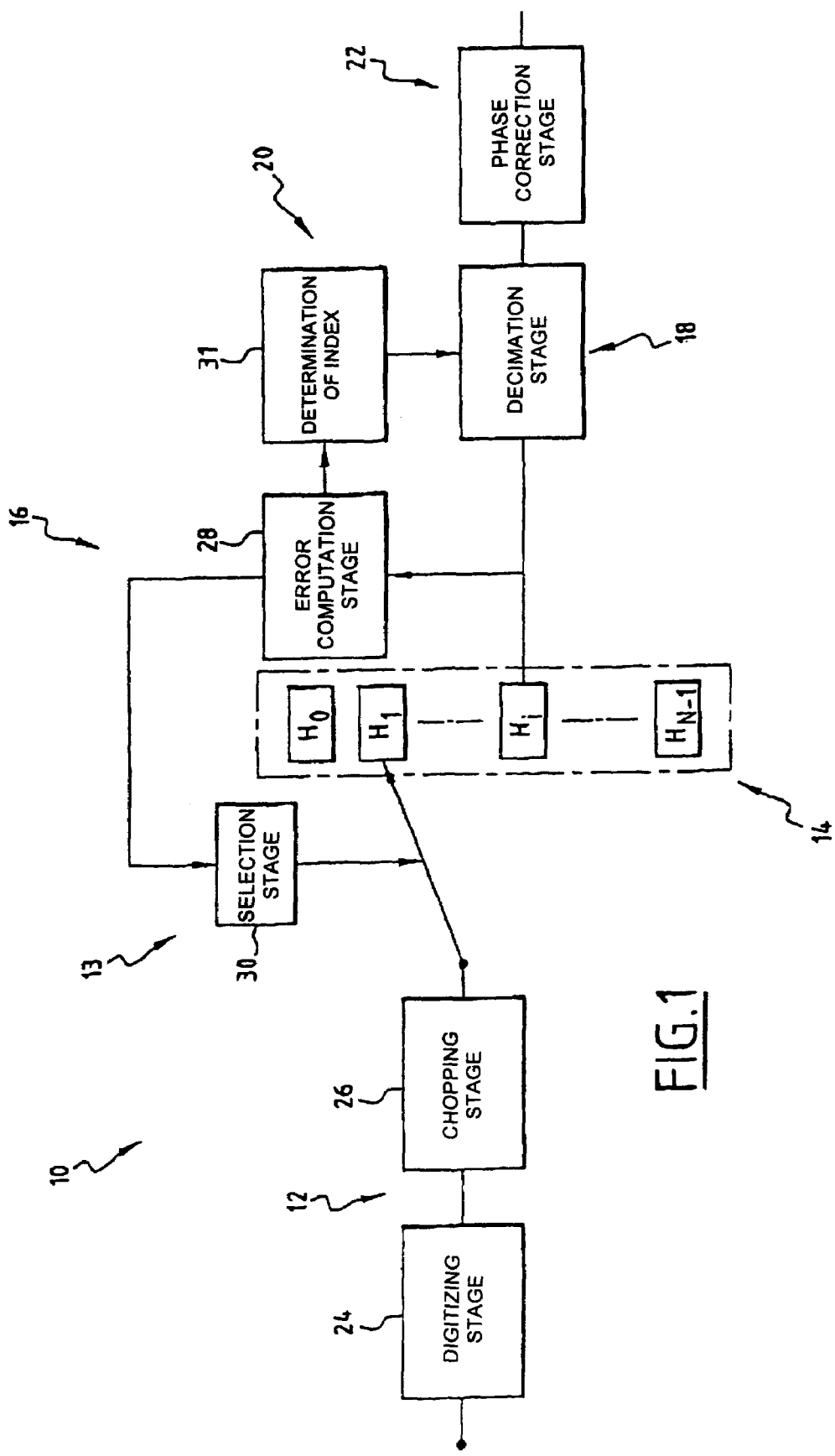
FIG. 1 is a diagrammatic view of a device for the digital demodulation of a signal received according to the invention.

The device 10 illustrated in FIG. 1 is suitable for the digital demodulation of a modulated communication signal. It is intended to be implemented in a digital communication receiver, such as a mobile telephone or a base station of a wireless telecommunication network.

This device 10 essentially comprises a digitizing module 12 followed by means 13 for correcting the sampling instant. These means 13 essentially comprise a polyphase filter 14 associated with means 16 of selection of an elementary filter of the polyphase filter, a decimating stage 18 associated with means 20 for determining the shift of the decimation index, and finally a phase corrector 22.

Illustrated in FIG. 1 are functional blocks explaining the functions implemented in the processing of the signal. However, and according to the invention, the various functions are implemented by one or more data processors executing suitable processing programs.

The device 10 illustrated in FIG. 1 is suitable for receiving at input a signal modulated for example according to a modulation of PSK type (Phase Shift Keying). This signal is received by a digitizing stage 24. This stage 24 is suitable for supplying a digital signal demodulated coherently or incoherently.

The digitizing stage 24 is suitable for digitizing, with an oversampling factor denoted P, the modulated signal. The oversampling factor is equal to the number P of samples per symbol. The latter is advantageously as small as possible. It is however, greater than or equal to 2. It is advantageously less than or equal to 4 in the device according to the invention.

The digitization is performed at the radio frequencies, at the intermediate frequencies or in baseband. If the digitized signal is not a baseband signal, a frequency shift is performed digitally and coherently or incoherently so as to bring the signal directly to baseband.

The baseband signal obtained is of complex kind. Thus, it comprises an in-phase part, denoted I, and a quadrature part, denoted Q.

The in-phase and quadrature parts are processed either independently of one another according to similar algorithms, or jointly.

In FIG. 1, the functional blocks are undifferentiated. They are for example suitable for processing on the one hand the in-phase part I of the signal and on the other hand the quadrature part Q.

A stage 26 for chopping the demodulated digital signal into blocks of S samples is provided at the output of the digitizing stage 24. The number S of samples per block is a multiple of the oversampling factor P.

This chopping into blocks is performed on each of the in-phase I and quadrature Q parts of the signal.

The subsequent processes performed in the means 13 for correcting the sampling instant are performed block by block so as to reduce the time for loading and for booting the functions introduced by the process for calling functions. Likewise, the phase corrections in the corrector 22 are established block by block, the phase errors being assumed stationary or negligible over a block.

The size of the blocks is defined as a function of a compromise between:

the magnitude of the frequency shift between the clocks of the converters on transmission and on reception, the time of loading and of booting of the functions which is introduced by the calling of the functions, the magnitude of the frequency shift between the carriers on transmission and on reception, the number of elementary filters of the polyphase filter compared with the drifting of the clocks.

The blocks obtained at the output of the chopping stage 26 are then processed by the complex polyphase filter 14.

This polyphase filter 14 comprises N elementary complex filters or branches. Each elementary filter is denoted $H_i$ with $i \in [0, \ldots, N-1]$. The number N of polyphase filters is for example equal to 8, 16, 32, 64, 128, 256 or more. It is not compulsory for this number to be a power of 2. The number of filters is preferably large and is advantageously greater than 256.

In particular and advantageously, the oversampling factor P is chosen small while the number N of elementary filters is chosen large. Preferably the ratio P/N is less than 1.

The polyphase filter 14 is implemented by a processor associated with means for storing a functional definition of each elementary filter $H_i$.

In particular the functional definition of each filter is constituted by a table of coefficients. Thus, N tables of coefficients are stored.

Each table of coefficients represents the digitization, previously performed, of the impulse response of the relevant elementary filter $H_i$, each for a given phase or shift as explained hereinbelow.

The in-phase I and quadrature Q parts of each block are processed by one and the same elementary filter $H_i$ of the polyphase filter. The complex polyphase filter is built from two identical polyphase filters, one for the in-phase part, the other for the quadrature part.

Each elementary filter of the polyphase filter is constituted by the digitization of the reception filter for a sampling period denoted Te. Each of the digitizations has a specific phase given by the formula:

$$h_i[k] = h(t)|_{t=kTe+\frac{i}{N}Te-\frac{Te}{2}} \quad i = 0 \ldots N-1$$

The phase variation of the N elementary filters spreads from −Te/2 to (Te/2−Te/N) so as to cover a complete sampling period Te.

Each elementary filter $H_i$ has a phase shifted by 1/Nth of a sampling period Te with respect to the previous elementary filter $H_{i-1}$.

The larger is N, the smaller is the phasewise discretization spacing, thus leading to the possibility of correcting the sampling instant accurately.

The computation of the coefficients of the table individual to each elementary filter $H_i$ of the polyphase filter is carried out in the course of the program initialization phase.

Each elementary filter is a particular version of one and the same reference reception filter, and in this regard complies with the frequency-selective nature thereof. Each elementary filter can advantageously ensure the suppression of inter-symbol interference. Accordingly, a filter of "Root Raised Cosine" type can advantageously serve as a basis for the definition of each of the elementary filters associated with distinct phases.

Furthermore, the reference reception filter serving as basis, to within the phase variation, for the elementary filters is suitable for limiting the noise, and is known per se.

They may advantageously be suitable filters maximizing the signal-to-noise ratio.

The elementary filter $H_i$ implemented by the computer for a given block is determined as a function of a tracking algorithm implemented by the means 16 of selection of an elementary filter.

These means 16 comprise a stage 28 for computing an error signal in respect of a relevant block. The error signal produced by the stage 28 is individual to the mode of modulation used for the transmission of the data. The example which follows is suitable for PSK type modulations.

In this case, the error signal is formed of the set of standard deviations σ computed over the moduli of all the symbols belonging to a block, for each of the P sampling instants for one and the same symbol.

For each sampling instant k, the standard deviation $\sigma_k$ is given by:

$$\sigma_k = \sqrt{\frac{\sum_{i=0}^{L-1} z^2[k+i\cdot P]}{L-1} - \frac{\left\{\sum_{i=0}^{L-1} z[k+i\cdot P]\right\}^2}{L(L-1)}}$$

The error signal supplied by the stage 28 is used by a selection stage 30 making it possible to select the elementary filter $H_i$ of the polyphase filter by implementing the tracking algorithm. Moreover, the same error signal is furthermore used by a stage 31 for evaluating the error signal of the means 20 for determining the shift of the decimation index controlling the means 18.

In particular, the stage 31 of the means 20 is suitable for selecting the minimum standard deviation $\sigma_k$ appearing in the error signal.

The selecting of the minimum standard deviation $\sigma_k$ leads to the reducing of the phase error and constitutes the error criterion making it possible to control the decimating stage 18 on the basis of the index $\hat{k}$ corresponding to the minimum standard deviation.

The index $\hat{k}$ selected by the stage 31 is given by the relation:

$$\hat{k} = arg \max_{k=0\ldots P-1}(\sigma_k)$$

where:
P the number of samples per symbol,
k the index relating to the decimation shift (offset),
z the modulus of the samples after the reception filter,
L the number of symbols per block.

The stage 31 determines, from the error signal supplied by the error computation stage 28, the shift $\hat{k}$ as being the index of the sampling instant corresponding to the minimum of the computed standard deviations.

Thus, the stage 31 is suitable for controlling a decimation leading to the largest aperture of the eye diagram.

The decimating stage 18 is suitable for extracting L samples per block from the samples received at the output of the polyphase filter 14, while retaining only one sample out of P samples from the $\hat{k}^{th}$ sample. Hence, only one sample per symbol remains.

The decimation operation can be defined simply by the following formulation:

$$z\text{dec}(n) = z(\hat{k}+n\cdot P)$$

for n=0, . . . , L−1
where:
$\hat{k}$ is the index of the sampling instant corresponding to the minimum of the standard deviations $\sigma_k$, and P is the oversampling factor.

The decimated data are then addressed to the phase corrector 22.

The phase correction can be performed using two types of algorithms: either using an algorithm employing the a priori knowledge of the data to be transmitted, or using an algorithm not employing same.

This phase correction is applied to the decimated samples so as to compensate for the phase rotations introduced by:
the propagation of the signals through a time varying propagation channel,
the continual changing of elementary filter of the polyphase filter leading to phase jumps with each change of block, and
the difference in carrier between the sender and the receiver.

A block-by-block update thus makes it possible to achieve carrier synchronization.

Figure 2:
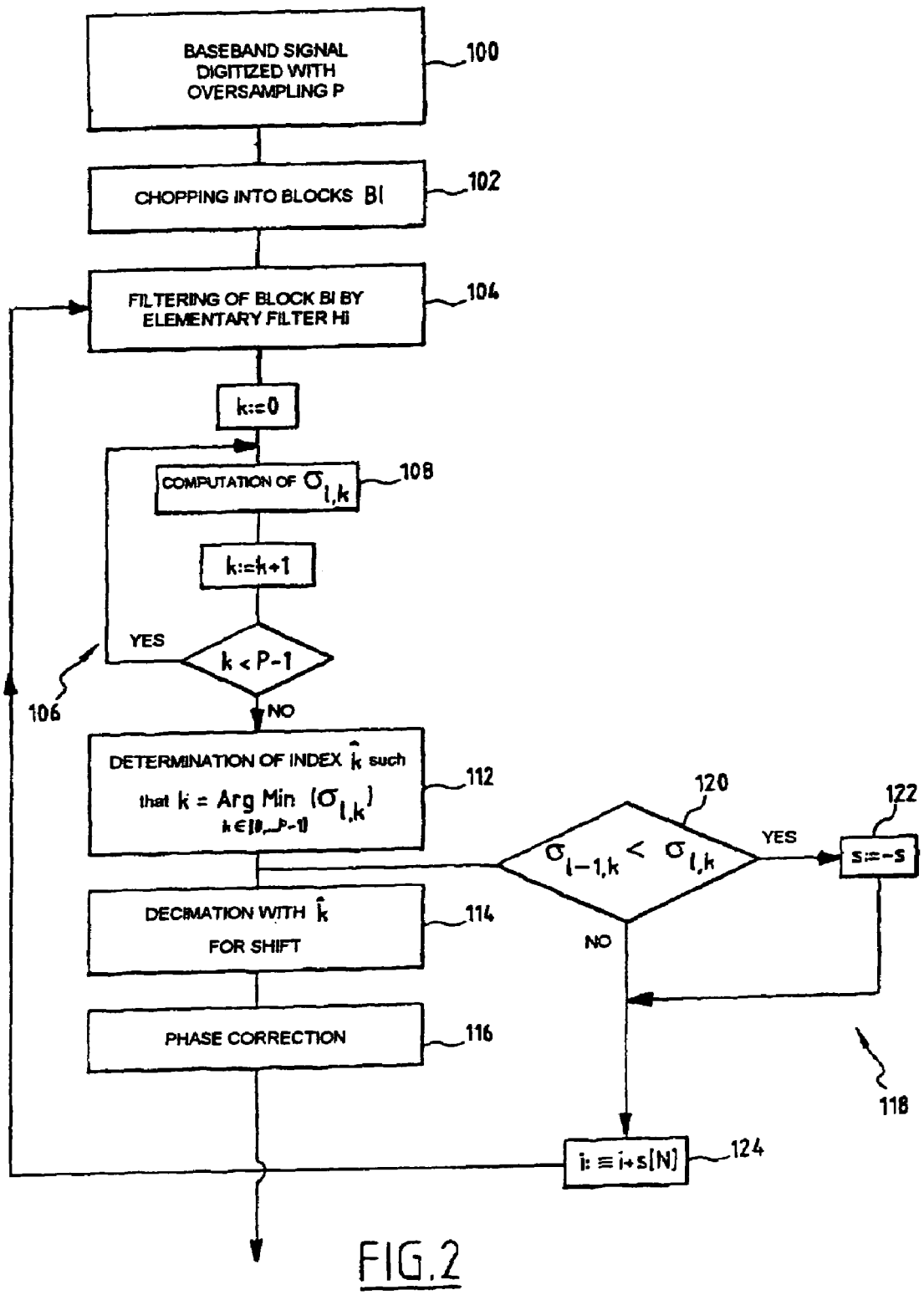
FIG. 2 is a flowchart explaining the operation of the device of FIG. 1.

According to the invention, the complex polyphase filter 14, the stages for computing the error signal 28, the selection stage 30, the evaluation stage 31 and the decimation stage 18 are implemented by one or more computers executing a suitable program, the main algorithm of which is illustrated in FIG. 2.

The manner of operation of the selection stage 30 is illustrated in particular in this algorithm.

At input, the device receives a modulated signal.

In step 100, the digitizing stage 24 ensures demodulation of the signal with an oversampling by a factor P, and puts the digitized signal into baseband. The digitized baseband signal is then processed block after block by implementing a loop.

In step 102, the digitized signal is chopped into blocks of S samples, the successive blocks being denoted $B_l$.

In step 104, the relevant block $B_l$ is processed by an elementary digital filter $H_i$ of the polyphase filter 14. The index i of the elementary filter $H_i$ implemented is determined by the selection stage 30. This selection algorithm is described later.

When initializing the method, the elementary filter implemented is selected arbitrarily. The latter is for example the one having the index i given by i=E((N−1)/2) where E designates the integer part function and N the number of elementary filters.

For the processing of the samples by the selected elementary filter, the computer implements the table of coefficients individual to the elementary filter $H_i$, this elementary table being selected in memory by a pointer defined by the selection means 30.

The computation and the storage of the tables of coefficients for each elementary filter of the polyphase filter is carried out by the computer in the course of the program initialization phase.

In memory, the elementary filters Hi are ordered according to the order of the indices in ascending or descending order of phase.

In step 106, the stage 28 performs the computation of the error signal. Accordingly, a loop is implemented in which is computed, in step 108, the set of standard deviations associated with the block $B_l$ for each of the oversampling indices lying between 0 and P−1. These standard deviations forming the error signal are denoted $\sigma_{l,j}$.

On completion of this loop, the stage 31 determines, in step 112, the decimation index $\hat{k}$ such that $$\hat{k} = arg \max_{k=0 \ldots P-1} (\sigma_k).$$

In step 114, the decimation stage 18 ensures the extraction of the L samples from the samples received, retaining only one sample out of P from the $\hat{k}^{th}$ sample determined in step 112.

In step 116, the phase corrector 22 processes the filtered and decimated block $B_l$.

Step 102 and the following steps are again implemented for the next block $B_{l+1}$.

Moreover, on completion of step 112, the selection stage 30 implements the tracking algorithm corresponding to the routine 118 of the algorithm of FIG. 2.

The aim of this algorithm is to determine the elementary filter $H_i$ of the polyphase filter most suitable for the reception process in respect of the next block $B_{l+1}$. This elementary filter $H_i$ adopted is the one which makes it possible to minimize the standard deviation σ of the modulus of the decimated data.

The tracking algorithm is used so as to avoid computing the standard deviation σ of the modulus of all the elementary filters $H_i$ of the polyphase filter 14.

This algorithm requires the storage from one block to another:
of a direction of tracking from among the ordered elementary filters;
of the standard deviation $\sigma_{l-1,k}$ associated with the polyphase filter used for the decimation of the previous block $B_{l-1}$.

The direction of tracking is given by a variable denoted s which can take the values +m and −m, with m ∈] and m<N. For example m=1. The value +m corresponds to an incrementation of the indices among the elementary filters of m ranks and the value −m corresponding to a traversal of m ranks in the direction of descending indices among the elementary filters.

More precisely, in step 120, a test is performed to compare the current standard deviation $\sigma_{l,k}$ associated with the elementary filter $H_i$ used for block $B_l$ with the decimation standard deviation $\sigma_{l-1,k}$ associated with the elementary filter $H_j$ used for the previous block $B_{l-1}$. If the current decimation standard deviation $\sigma_{l,k}$ is less than the previous decimation standard deviation $\sigma_{l-1,k}$, the direction of tracking is kept unchanged in step 122.

If such is not the case, the direction of tracking is reversed.

In step 124, the index of the elementary filter $H_i$ which has to be used for the next block $B_{l+1}$ is computed by incrementation modulo N of the index of the filter previously used by the value s. Thus, the selected elementary filter is $H_{i+s}$. The computation modulo N of the next index makes it possible to keep the index i in the interval [0, N−1].

For the current block $B_l$, if the minimum standard deviation is less (respectively greater) than the previous, the direction of tracking is maintained (respectively reversed). Finally, at each block, the elementary filter index is either incremented by the value m or decremented by the value m according to the direction of tracking. Thus notch by notch the algorithm converges towards the elementary filter which will exhibit the lowest standard deviation. When the index of the elementary filter reaches the ends 0 or N−1, corresponding respectively to descending and ascending directions of tracking, then the index of the elementary filter selected for the next block will be equal respectively to N−1 and 0 in the case where m=1. In this case, the decimation of the block will itself be done with a decimation index modified by P−1 units, since the sample representative of the symbol changes.

The tracking algorithm comprises three phases:
An initialization phase comprising the arbitrary selection of one of the elementary filters, as well as the definition of a direction of tracking (increasing or decreasing elementary filter index).
A transient or tracking regime: the error in phase between the transmission digitization and reception digitization is stationary but the most suitable elementary filter has not been attained having regard to the convergence time of the algorithm imposed by the possibilities of reduced modification of elementary filter index from one block to another (incrementation or decrementation by one unit). The error in phase between transmission digitization and reception digitization fluctuates, and in this case, the algorithm tracks the fluctuation.

A steady state regime. The error in phase between the transmission digitization and reception digitization is stationary, in this case, the algorithm oscillates between the two most suitable consecutive elementary filters if m=1. The degradation afforded by the constant changing from one elementary filter to another is regarded as negligible if a sizeable number of elementary filters of the polyphase filter is used.

The polyphase filter of the demodulating device according to the invention being implemented by a computer using for each elementary filter a previously stored functional definition of the filter makes it possible to use a polyphase filter having a very large number of elementary filters. Specifically, regardless of the number of elementary filters, the footprint on the circuit is limited to the footprint of the processor and of the associated memories. The latter are moreover very often integrated into the processor. Now, a great many tables of coefficients representative of the impulse response of an elementary filter may be stored in a memory having a small footprint.

Since the number of elementary filters may be very large, it is possible to choose a small initial oversampling coefficient P, while retaining very high reception quality.

Specifically, by resorting to the polyphase filter, the initial signal is virtually oversampled by a factor N×P. Stated otherwise, it is possible to obtain the quality of a signal oversampled by a factor N×P, while making the processor carry out only the computations for the case of a signal oversampled by a factor P.

The oversampling coefficient P being small, the computation time for the implementation of an elementary filter is much reduced, thereby making it possible to demodulate the data with a high real-time throughput.

Moreover, insofar as any receiver requires a noise-limiting filter at input, in the demodulating device according to the invention, each of the elementary filters of the polyphase filter corresponds to a noise limitation filter. Thus, even if the polyphase filter increases the complexity of the device, the latter will not be compounded with the other elements normally constituting the demodulating device and will merely be integrated into the noise limitation filter.

The tracking method used for selecting the elementary filter of the polyphase filter for each block converges rapidly towards a satisfactory filtering solution. This method makes it possible to compute just one error signal for each block and to compare just the standard deviations corresponding to the error signals of the previous block. Thus, the algorithm requires only reduced computational power. It is also conceivable to make the procedure more robust by averaging the error signal over several blocks.

Furthermore, insofar as the error signal produced by the stage 28 is used both for the selection of the elementary filter $H_i$ of the following block and for the determination of the shift $\tilde{k}$ used for the decimation of the block undergoing processing, the computer has only few computations to perform, thus increasing the speed of implementation of the demodulation method.

As a variant, the value of the spacing m used in the tracking algorithm can be modified during the implementation of the algorithm. In particular, before the tracking algorithm reaches a steady state regime, the value m of the spacing may be chosen large, then may be reduced automatically during the implementation of the algorithm, eventually being equal to the value 1, when the algorithm is in its steady state regime. The steady state regime can be detected by the presence of a succession of reversals of the direction of tracking.

In the example described hereinabove, the demodulating device is implemented by a computer operating according to a suitable algorithm. This solution is advantageous for the reasons already set forth. However, as a variant, the device can be implemented by hardware rather than software means, ensuring digital and/or analogue processing of the signal on the basis of circuits whose wiring and structure are suitable for performing the various functions required.

What is claimed is:

1. Device for the digital demodulation of a signal received in respect of a digital communication receiver, comprising:
a stage for sampling the signal received with an oversampling factor of P samples per symbol, configured to output an oversampled signal;
a stage for chopping the oversampled signal into successive blocks of samples; and
means for correcting a sampling time for each successive block of samples, said means for correcting comprising,
a polyphase filter comprising a set of N distinct elementary digital filters, and
means for selecting one elementary digital filter for each block, from the set of N distinct elementary filter;
where the means for selecting one elementary digital filter comprise; means for computing error signals,
means for comparing performance indicators for the elementary digital filters implemented for at least two successive blocks, wherein performance indicators arise from the error signals, and
means for determining the elementary digital filter to be implemented for a next block based on a function of a result of the means for comparing, wherein
the distinct elementary digital filters are ordered, and
the means for determining is configured to choose an elementary digital filter whose rank with respect to an elementary digital filter that was previously selected is shifted by a number of spaces, according to the order of the elementary digital filters, and is shifted in a direction determined by the result of the means for comparing performance indicators, wherein the comparison is performed for at least one previous block.

2. The device according to claim 1, wherein each elementary digital filter is configured to perform its own filtering function, the filtering function including at least one of canceling an interference between symbols, or filtering of a noise.

3. The device according to claim 1, wherein the number of shifting spaces is a predetermined constant number of spaces.

4. The device according to claim 1 wherein the number of shifting spaces is variable over time, the device further comprising:
means for reducing the number of shifting spacings in the course of the implementation of the device.

5. The device according to claim 1, wherein the distinct elementary digital filters are filters of a same kind, mutually differentiated by a distinct elementary digital filter's phase.

6. The device according to claim 1, further comprising:
a decimating stage configured to select samples in each block on completion of the digital filtering implemented by the processor thereby retaining only one sample.

7. The device according to claim 6, wherein the means for determining the samples include:
means for evaluating the error signal based on a calculation of the means for computing error signals, the evaluating of the error signal suitable for determining the samples to selected in a relevant block.

8. The device according to claim 7, wherein the means for computing error signals calculates the error based on both the means for selecting of the elementary digital filter and to the means for determining samples.

9. A digital communication receiver of a wireless telecommunication network, including a device for the digital demodulation of a siganal received according to any one of claims 1 to 8.

10. A base station of a wireless telecomunication network, including a device for the digital demodulation of a signal received according to any one of claims 1 to 8.

11. A method of digital demodulation of a signal received in a digital communication receiver, comprising:
sampling the signal received with an oversampling factor of P samples per symbol, to create an oversampled signal;
chopping the oversampled signal into successive blocks of samples; and
correcting a sampling time for each successive block of samples, by implementing a polyphase filter including a set of N distinct elementary digital filters, by selecting an elementary digital filter for each block,
wherein the selecting of an elementary digital filter comprises:
computing error signals for the polyphase filters;
producing performance indicators for the elementary digital filters from the error signals;
comparing the performance indicators for the elementary digital filters implemented for at least two successive blocks; and
determining the elementary digital filter to be implemented for the next block base on a function of the comparing, wherein
the distinct elementary digital filters are ordered, and
the determining the elementary digital filter includes choosing an elementary digital filter whose rank with respect to an elementary digital filter previously selected is shifted by a number of spaces according to the order of the filters, and is shifted in a direction determined by the comparing the performance indicators implemented for at least one previous block.

* * * * *